(12) United States Patent
Abuelma'atti

(10) Patent No.: US 8,188,773 B1
(45) Date of Patent: May 29, 2012

(54) VOLTAGE-CONTROLLED DUAL-SLOPE SQUARE AND TRIANGULAR WAVEFORM GENERATOR

(75) Inventor: Muhammad Taher Abuelma'atti, Dhahran (SA)

(73) Assignee: King Fahd University of Petroleum & Minerals, Dhahran (SA)

( * ) Notice: Subject to any disclaimer, the term of this patent is extended or adjusted under 35 U.S.C. 154(b) by 0 days.

(21) Appl. No.: 13/074,981

(22) Filed: Mar. 29, 2011

(51) Int. Cl.
*H03K 5/12* (2006.01)
(52) U.S. Cl. ......................... 327/134; 327/170
(58) Field of Classification Search .................. 327/134, 327/170
See application file for complete search history.

(56) References Cited

U.S. PATENT DOCUMENTS

| | | | |
|---|---|---|---|
| 3,943,456 A * | 3/1976 | Luce | 327/134 |
| 4,422,044 A | 12/1983 | Mueller | |
| 4,449,059 A | 5/1984 | Dickes | |
| 4,503,396 A | 3/1985 | Fawkes | |
| 4,516,038 A | 5/1985 | Glennon | |
| 4,894,560 A * | 1/1990 | Chung | 327/134 |
| 5,438,291 A * | 8/1995 | Carbou et al. | 327/170 |

OTHER PUBLICATIONS

NTE864 Precision Waveform Generator, NTE Electronics, Inc. website: http://www.nteinc.com/specs/800to899/pdf/nte864.pdf.
Int. J. Electronics, vol, 91, No. 3, Mar. 2004: A low-cost dual-slope triangular/square wave generator. Muhammad Taher Abuelma'atti et al.
XXXII National Systems Conference, NSC 2008, Dec. 17-19, 2008: Mocccii-Based Function Generator With Grounded Passive Components.

* cited by examiner

*Primary Examiner* — Lincoln Donovan
*Assistant Examiner* — William Hernandez
(74) *Attorney, Agent, or Firm* — Richard C. Litman

(57) ABSTRACT

The voltage-controlled dual-slope square and triangular waveform generator is an electronic circuit that includes a plus-type second-generation current conveyor operably connected to a single operational amplifier. At the input stage to the operational amplifier, two metal-oxide semiconductor (MOS) transistors are configured as switches. Three resistors and a grounded capacitor are included in the electronic circuit, thereby maintaining a low component count. The leading and trailing slopes of the waveform are independently adjustable by selection of the voltages $V_1$ and $V_2$ that are selectively connectable to the y-input of the CCII+ via switching action of the MOS transistors. The frequency of the waveform is adjustable via the voltage divider ratio between the output and noninverting input of the operational amplifier. The simple and elegant nature of the circuit design provides a low-cost waveform generator that can be adjusted both for frequency and for independent leading edge and trailing edge slopes.

2 Claims, 1 Drawing Sheet

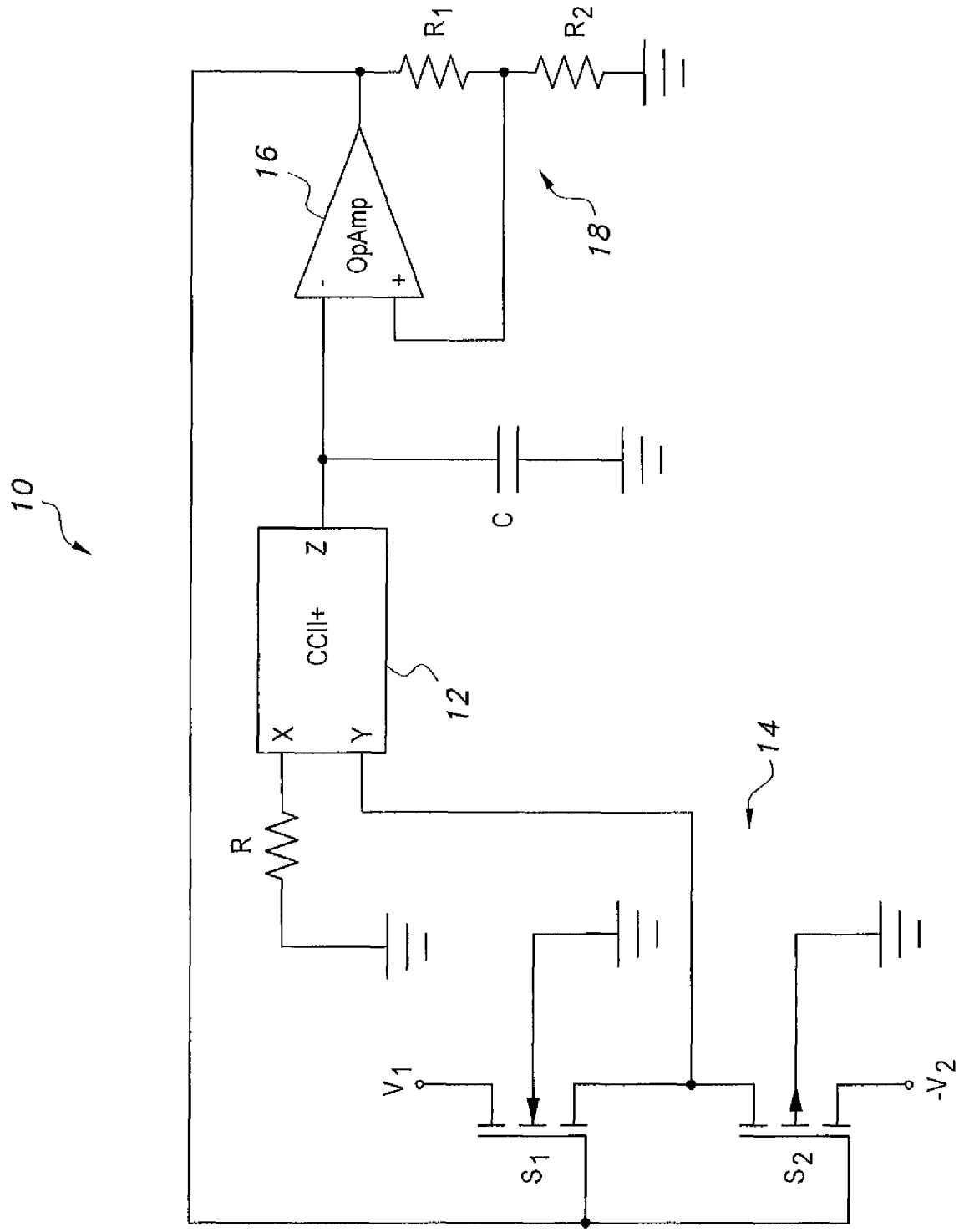

VOLTAGE-CONTROLLED DUAL-SLOPE SQUARE AND TRIANGULAR WAVEFORM GENERATOR

BACKGROUND OF THE INVENTION

1. Field of the Invention

The present invention relates to function generators, and particularly to a voltage-controlled dual-slope square and triangular waveform generator.

2. Description of the Related Art

Triangular and square wave generators are widely used in a wide range of applications in measurement and instrumentation systems. This justifies the development of a large number of triangular and square wave generators using a variety of active elements, including operational amplifiers, current conveyors, and current mirrors using discrete transistors. Most of these circuits cannot generate voltage-controlled dual-slope triangular waves.

Thus, a voltage-controlled dual-slope square and triangular waveform generator solving the aforementioned problems is desired.

SUMMARY OF THE INVENTION

The voltage-controlled dual-slope square and triangular waveform generator is realized by an electronic circuit that includes a plus-type second-generation current conveyor operably connected to a single operational amplifier. At the input stage to the operational amplifier, two metal-oxide semiconductor (MOS) [field-effect] transistors are configured as switches. Three resistors and a grounded capacitor are included in the electronic circuit, thereby maintaining a low component count.

These and other features of the present invention will become readily apparent upon further review of the following specification and drawings.

BRIEF DESCRIPTION OF THE DRAWINGS

The sole drawing FIGURE is a schematic diagram of a voltage-controlled dual-slope square and triangular waveform generator circuit according to the present invention.

Similar reference characters denote corresponding features consistently throughout the attached drawings.

DETAILED DESCRIPTION OF THE PREFERRED EMBODIMENTS

The voltage-controlled dual-slope square and triangular waveform generator is an electronic circuit that includes a plus-type second-generation current conveyor (CCII+) operably connected to a single operational amplifier. At the input stage to the operational amplifier, two metal-oxide semiconductor (MOS) transistors are configured as switches. Three resistors and a grounded capacitor are included in the electronic circuit, thereby maintaining a low component count. The leading and trailing slopes of the waveform are independently adjustable by selection of the voltages $V_1$ and $V_2$ that are selectively connectable to the y-input of a CCII+ 12 via switching action of the MOS transistors. Plus, i.e., positive polarity second-generation current-conveyors, such as CCII+ 12, are well known in the art. Details and theory of operation of an exemplary CCII, such as CCII+ 12, are included in U.S. Pat. No. 3,619,798, issued on Nov. 9, 1971, which is hereby incorporated by reference in its entirety. The frequency of the waveform is adjustable via the voltage divider ratio between the output and the inverting input of the operational amplifier 16. The simple and elegant nature of the circuit design provides a low cost waveform generator that can be adjusted both for frequency and for independent leading edge and trailing edge slopes.

Referring to the FIGURE, the operational amplifier 16 is shown to be configured as a Schmitt trigger with output voltages either $V_{sat+}$ or $V_{sat-}$, and with first and second threshold voltages $V_{TH}=\beta V_{sat+}$ and $V_{TL}=\beta V_{sat-}$ where $\beta=R_2/(R_1+R_2)$. The MOSFET transistors 14 act as switches $S_1$ and $S_2$. When the output voltage of the Schmitt trigger 16 is $V_{sat+}$, switch $S_1$ will close and switch $S_2$ will open. Thus, the voltage $V_1$ will appear at terminal y of the plus-type second-generation current-conveyor 12 (CCII+). This will produce an outward current $I_1=V_1/R$ through terminal x of the second-generation current conveyor 12. An equal outward current will be produced in terminal z of the second-generation current conveyor 12.

This current will charge the capacitor linearly at a constant rate $=I_2/C$. When the voltage across the capacitor reaches the first threshold voltage $V_{TH}$, the output voltage of the Schmitt trigger 16 switches to $V_{sat-}$. Thus, switch $S_2$ will close and switch $S_1$ will open, and the voltage $-V_2$ will appear at terminal y of the second-generation current conveyor 12. This will produce an inward current $I_2=V_2/R$ through terminal x of the second-generation current conveyor 12. An equal inward current will be produced in terminal z of the second-generation current conveyor 12. This current will discharge the capacitor linearly at a rate $=I_2/C$ and the voltage across the capacitor will start decreasing. When the voltage across the capacitor reaches the second threshold voltage $V_{TL}$, the output voltage of the Schmitt trigger switches to $V_{sat+}$ and the cycle is repeated. Thus, the slope of the positive-going edge of the capacitor voltage and the charging time will be given by:

$$S_+ = \frac{V_1}{RC} \qquad (1)$$

and $$T_1 = CR\frac{V_{TH} - V_{TL}}{V_1} \qquad (2)$$

Similarly, the slope of the negative-going edge of the triangular wave and the discharging time will be given by:

$$S_- = \frac{V_2}{RC} \qquad (3)$$

and $$T_2 = CR\frac{V_{TH} - V_{TL}}{V_2} \qquad (4)$$

From equations (2) and (4), the frequency of oscillation can be expressed as:

$$f = \frac{1}{T_1 + T_2} = \frac{1}{CR}\frac{1}{V_{TH} - V_{TL}}[V_1 + V_2] \qquad (5)$$

Equations (1), (3) and (5) show that, while it is possible to control the frequency of oscillation by adjusting the resistor $R_1$ and/or $R_2$ of voltage divider 18, thus adjusting the threshold voltages $V_{TH}$ and $V_{TL}$, without disturbing the slopes of the positive- and negative-going edges of the triangular waveform obtained across the capacitor C, the slopes of this triangular waveform cannot be controlled without disturbing the frequency of oscillation. It is therefore recommended to start adjustments by controlling the slopes of the positive- and negative-going edges of the triangular wave via adjustment of the voltages $V_1$ and/or $V_2$, as required, and then controlling the frequency of oscillation by adjusting the resistors $R_1$ and/or $R_2$ of the voltage divider 18.

A simple voltage-controlled dual-slope square/triangular waveform generator 10 has been disclosed herein. The circuit 10 can be easily implemented using commercially available integrated circuits, for example an AD844 for the CCII+ and a 741 operational amplifier as the Schmitt trigger. In addition to the second-generation current conveyor 12 and the operational amplifier 16, the circuit uses two MOSFET transistors 14, divider resistances 18 (R1 and R2), CCII+ x-input resistor R, and a grounded capacitor C.

It is to be understood that the present invention is not limited to the embodiments described above, but encompasses any and all embodiments within the scope of the following claims.

I claim:

1. A voltage-controlled dual-slope square and triangular waveform generator, comprising:
    means for conveying current, the current conveying means consisting of a single positive polarity second-generation current conveyor having an x-input, a y-input, and a z-output, the x-input being configured as a reference input;
    first and second semiconductor switches operably connected to switch first and second voltages, respectively, the first voltage being positive with respect to ground potential and the second voltage being negative with respect to ground potential, switching output of the first and second semiconductor switches having a connection to the y-input of the single positive polarity second-generation current conveyor;
    an operational amplifier having a noninverting input, an inverting input, and an output, the output having a feedback connection to control inputs of the first and second switches, the inverting input being connected to the z-output of the single positive polarity second-generation current conveyor and a capacitor regulating a rate of charge connected to a minus input thereof; and
    a voltage divider operably connected to the output and the noninverting input of the operational amplifier to configure the operational amplifier as a Schmitt trigger, resistance ratios of the voltage divider adjusting a frequency of an electronic waveform produced at the output of the Schmitt trigger;
    wherein leading edge and trailing edge slopes of the electronic waveform are independently adjustable via values of the first and second voltages and the electronic waveform frequency adjustment is independent of the leading and trailing edge slope adjustments.

2. A voltage-controlled dual-slope square and triangular waveform generator, comprising:
    a bistable oscillator electronic circuit having an oscillating waveform output and a control input;
    means for conveying current, the current conveying means consisting of a single positive polarity second-generation current conveyor having an x-input, a y-input, and a z-output, the x-input being configured as a reference input, the single positive polarity second-generation current conveyor output being connected to the control input of the bistable oscillator electronic circuit;
    means for regulating a rate of charge seen by the bistable oscillator electronic circuit control input, the means for regulating a rate of charge being based on a current amplitude produced by the single positive polarity second-generation current conveyor output;
    means for automatically selectively changing current direction of the single positive polarity second-generation current conveyor output between a first current direction and a second current direction, the means for automatically selectively changing current direction being operably connected to the y-input of the single positive polarity second-generation current conveyor;
    means for independently adjusting the second-generation current conveyor output current amplitude to a first value when the first current direction is present and to a second value when the second current direction is present, wherein a leading edge slope and a trailing edge slope of the bistable electronic circuit oscillating waveform output are independently adjustable; and
    means for adjusting a frequency of the bistable electronic circuit oscillating waveform output independent from the leading and trailing edge slopes.

\* \* \* \* \*